US011901310B2

United States Patent
Pang et al.

(10) Patent No.: US 11,901,310 B2
(45) Date of Patent: Feb. 13, 2024

(54) ELECTRONIC ASSEMBLY

(71) Applicant: Tesla, Inc., Austin, TX (US)

(72) Inventors: Mengzhi Pang, Cupertino, CA (US); Shishuang Sun, Cupertino, CA (US); Ganesh Venkataramanan, Sunnyvale, CA (US); William Arthur McGee, San Jose, CA (US); Steven Butler, Palo Alto, CA (US)

(73) Assignee: Tesla, Inc., Austin, TX (US)

( * ) Notice: Subject to any disclaimer, the term of this patent is extended or adjusted under 35 U.S.C. 154(b) by 380 days.

(21) Appl. No.: 17/276,071

(22) PCT Filed: Sep. 19, 2019

(86) PCT No.: PCT/US2019/051944
§ 371 (c)(1),
(2) Date: Mar. 12, 2021

(87) PCT Pub. No.: WO2020/061320
PCT Pub. Date: Mar. 26, 2020

(65) Prior Publication Data
US 2022/0051994 A1 Feb. 17, 2022

Related U.S. Application Data (60) Provisional application No. 62/733,472, filed on Sep. 19, 2018.

(51) Int. Cl.
*H01L 23/34* (2006.01)
*H01L 23/00* (2006.01)
(Continued)

(52) U.S. Cl.
CPC ........ *H01L 23/562* (2013.01); *H01L 25/0652* (2013.01); *H01L 25/18* (2013.01); *H01L 23/32* (2013.01); *H01L 23/5386* (2013.01)

(58) Field of Classification Search
CPC ... H01L 23/562; H01L 23/32; H01L 23/5386; H01L 25/0652; H01L 25/18
See application file for complete search history.

(56) References Cited

U.S. PATENT DOCUMENTS

| | | | |
|---|---|---|---|
| 2006/0000822 A1* | 1/2006 | Nakamura | ........ H01L 21/67103 219/409 |
| 2006/0169488 A1 | 8/2006 | Kaji | |

(Continued)

FOREIGN PATENT DOCUMENTS

| | | |
|---|---|---|
| CN | 102281715 | 12/2011 |
| EP | 2 144 483 | 1/2010 |

(Continued)

OTHER PUBLICATIONS

International Search Report and Written Opinion dated Feb. 10, 2020 in application No. PCT/US2019/051944.

*Primary Examiner* — Hoa C Nguyen
(74) *Attorney, Agent, or Firm* — Knobbe, Martens, Olson & Bear, LP (57) ABSTRACT

An electronic assembly includes a substrate having a first surface and a second surface opposite to the first surface and a plurality of stiffening members coupled to the substrate. The substrate further includes a plurality of substrate interconnects. The electronic assembly further includes a plurality of semiconductor dies mounted on the first surface of the substrate. The plurality of semiconductor dies are electrically connected to each other via the plurality of substrate interconnects. The electronic assembly further includes a plurality of power supply modules mounted on the second surface of the substrate. Each power supply module is disposed opposite to a respective semiconductor die.

23 Claims, 3 Drawing Sheets

(51) Int. Cl.
  *H01L 25/065* (2023.01)
  *H01L 25/18* (2023.01)
  *H01L 23/32* (2006.01)
  *H01L 23/538* (2006.01)

(56) References Cited

U.S. PATENT DOCUMENTS

| | | | |
|---|---|---|---|
| 2007/0224845 A1* | 9/2007 | Becker | H01L 23/3675 257/E23.087 |
| 2008/0157343 A1 | 7/2008 | Dattaguru et al. | |
| 2009/0116194 A1* | 5/2009 | Matsushiba | H01L 23/13 361/709 |
| 2009/0296360 A1 | 12/2009 | Doblar et al. | |
| 2015/0264810 A1 | 9/2015 | Baba et al. | |
| 2016/0037627 A1 | 2/2016 | Ueyama et al. | |
| 2020/0203301 A1* | 6/2020 | Yu | H01L 24/20 |

FOREIGN PATENT DOCUMENTS

| | | |
|---|---|---|
| JP | 11-154728 | 6/1999 |
| JP | 2013-084861 | 5/2013 |

\* cited by examiner

ELECTRONIC ASSEMBLY

BACKGROUND

Technical Field

The present disclosure relates generally to electronics, and more specifically to electronic assemblies.

Description of Related Art

Electronic assemblies are used in various industrial and consumer applications. Electronic assemblies typically include a plurality of packaged integrated circuits that reside upon a substrate panel. However, many installations have size constraints, limiting the area that may be occupied by the electronic assembly. Thus, some electronic assemblies may include a large number of components that are densely packed on the substrate panels.

Mounting a large number of components onto a substrate panel may lead to warpage of the substrate panel due to the weight and pressure of the components. Mounting components and leaving relatively large empty areas of the substrate panel between the components, or using a relatively large sized substrate panel may also cause warping of the substrate panel. Warpage may interfere with the mounting or assembly of components on the substrate panel or lead to circuit breaks or other problems with the components. Warpage may also impair an electrical performance of any electronic assemblies mounted to the substrate panel.

SUMMARY

One embodiment is an electronic assembly that includes: a substrate comprising a first surface and a second surface opposite to the first surface, the substrate further comprising a plurality of substrate interconnects; a plurality of semiconductor dies mounted on the first surface of the substrate, wherein the plurality of semiconductor dies are electrically connected to each other via the plurality of substrate interconnects; a plurality of power supply modules mounted on the second surface of the substrate, wherein each power supply module is disposed opposite to a respective semiconductor die; and a plurality of stiffening members coupled to the substrate.

Another embodiment is an electronic assembly that includes: a substrate comprising a first surface and a second surface opposite to the first surface, the substrate further comprising a plurality of substrate interconnects; a plurality of semiconductor dies mounted on the first surface of the substrate, wherein the plurality of semiconductor dies are electrically connected to each other via the plurality of substrate interconnects; a plurality of electrical connectors mounted on the second surface of the substrate, wherein each electrical connector is disposed opposite to a respective semiconductor die; a plurality of power supply modules corresponding to the plurality of semiconductor dies, wherein each power supply module is detachably connected to a respective electrical connector; and a plurality of stiffening members coupled to the substrate.

Yet another embodiment is an electronic assembly that has: a substrate comprising a first surface and a second surface opposite to the first surface, the substrate further comprising a plurality of substrate interconnects; a plurality of semiconductor dies mounted on the first surface of the substrate, wherein the plurality of semiconductor dies are electrically connected to each other via the plurality of substrate interconnects; a plurality of electrical connectors mounted on the second surface of the substrate, wherein each electrical connector is disposed opposite to a respective semiconductor die; a plurality of power supply modules corresponding to the plurality of semiconductor dies, wherein each power supply module is detachably connected to a respective electrical connector; and a plurality of stiffening members coupled to the substrate, wherein each stiffening member comprises a first stiffening portion disposed on the first surface of the substrate and a second stiffening portion disposed on the second surface of the substrate.

DETAILED DESCRIPTION

Embodiments of the invention relate to electronic substrate assemblies that include a stiffening member disposed as part of the assembly to prevent the substrate from warping, bending, cracking or breaking over time. One embodiment is an electronic assembly that includes a substrate for mounting electronic components. In this embodiment, the substrate includes a first surface and a second surface opposite to the first surface. A plurality of substrate interconnects may be disposed on, or within, the electronic assembly. The electronic assembly further may include a plurality of semiconductor dies mounted on the first surface of the substrate. The plurality of semiconductor dies can be electrically connected to each other via the plurality of substrate interconnects. In one embodiment, the electronic assembly has a plurality of power supply modules mounted on the second surface of the substrate. Each power supply module may be located opposite to a respective semiconductor die. In this embodiment, the electronic assembly further includes a plurality of stiffening members coupled to the substrate and used to provide support to the substrate.

Figure 1:
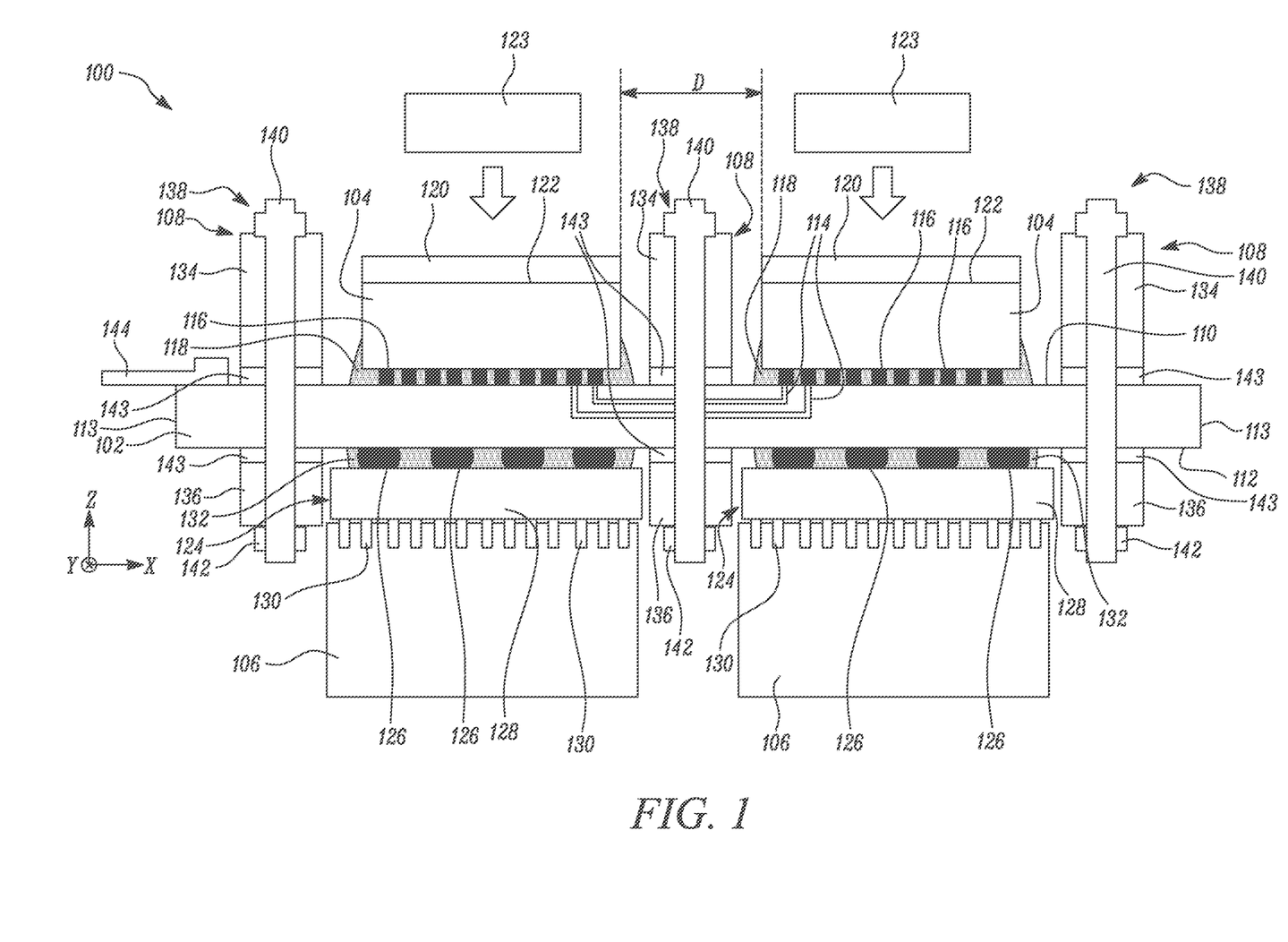
FIG. 1 is a sectional view diagram illustrating an electronic assembly constructed according to the present disclosure.
Figure 2:
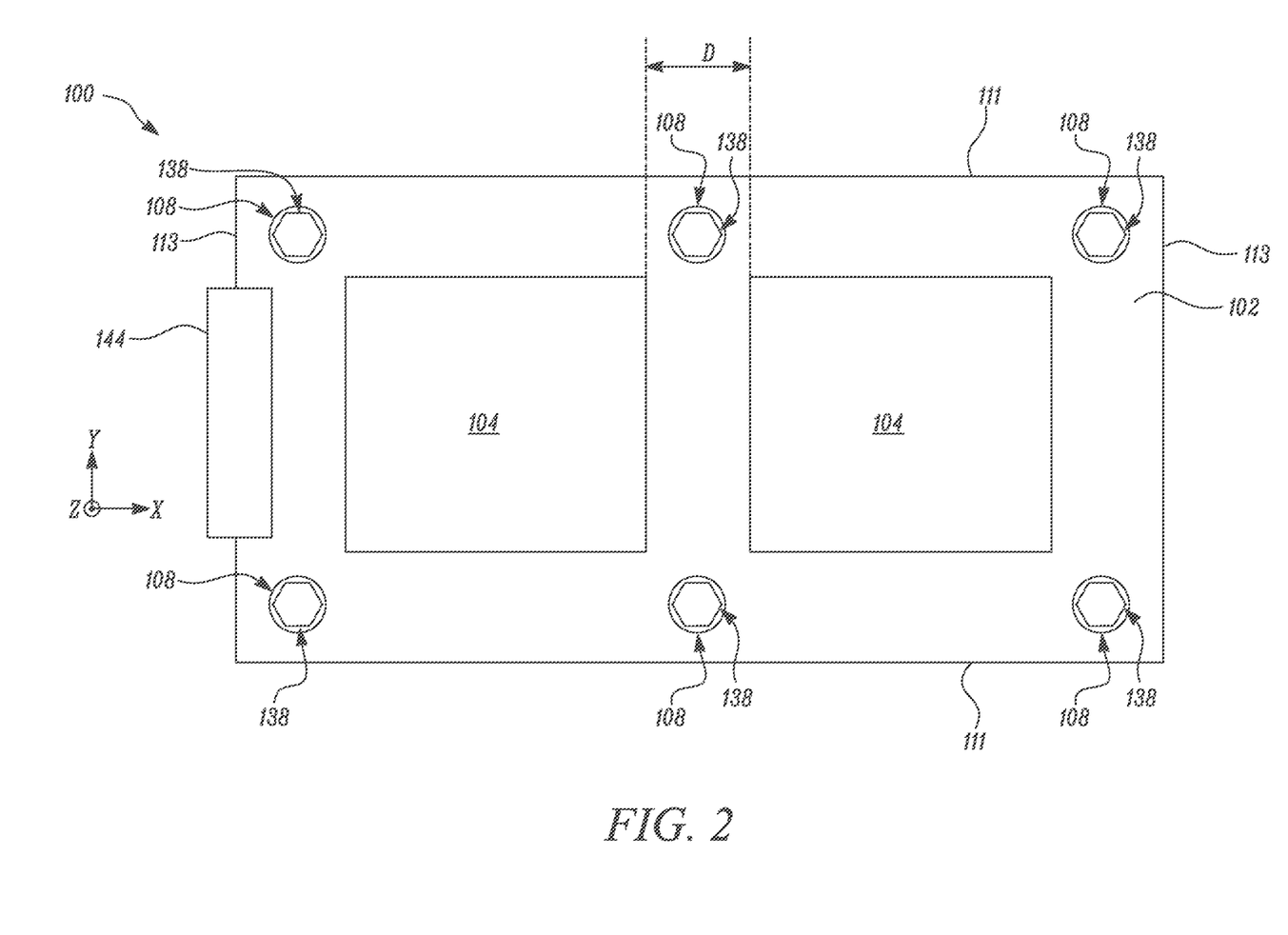
FIG. 2 is a top view diagram illustrating the electronic assembly of FIG. 1 according to the present disclosure.

One embodiment of an electronic assembly 100 is shown in FIG. 1, which is a sectional view diagram illustrating an electronic assembly 100 constructed according to the present disclosure. FIG. 2 is a top view of the electronic assembly 100 from FIG. 1. Electronic assembly 100 may be used in various industrial and consumer applications, such as electronic devices, vehicles, and so forth. Referring to FIGS. 1 and 2, electronic assembly 100 includes a substrate 102, a plurality of semiconductor dies 104 mounted to the surface of the substrate 102, a plurality of power supply modules 106, and a plurality of stiffening members 108.

Substrate 102 may have a generally planar structure. Substrate 102 defines X, Y and Z axes generally perpendicular to each other. Further, substrate 102 includes a first surface 110 and a second surface 112 opposite to the first surface 110 with respect to the Z-axis. First and second surfaces 110, 112 are oriented generally along the X-Y plane. Substrate 102 further includes a pair of longitudinal edges 111 opposite to each other, and a pair of lateral edges 113 opposite to each other. Longitudinal edges 111 and lateral edges 113 extend generally along the Z-axis. In certain embodiments, substrate 102 is an organic substrate made of an organic material. The organic material may include an epoxy resin or any suitable polymer. In other embodiments, substrate 102 is an inorganic substrate made of an inorganic material, such as a ceramic. Substrate 102 may be provided with an outer layer of solder mask for insulation and protection against oxidation. Substrate 102 includes a plurality of substrate interconnects 114. Substrate interconnects 114 may be intra-substrate interconnects that allow electrical connections between various components disposed on substrate 102. Substrate interconnects 114 may be provided in one or more locations on substrate 102, for example, first surface 110, second surface 112, one or more edges 111, 113, and within substrate 102. Substrate interconnects 114 may also be disposed in different planes or layers. Substrate interconnects 114 may include any electrically conductive element, such as copper-filled vias (e.g., microvias), copper wires, copper foils, conductive traces, conductive pads, or a combination thereof. In certain embodiments, substrate 102 is a High Density Interconnect (HDI) substrate panel that enables high density packaging of components on substrate 102. In other embodiments, substrate 102 is a Printed Circuit Board (PCB). Substrate 102 may also have a large area for accommodating multiple components. For example, substrate 102 may be a 200 mm×200 mm panel.

Semiconductor dies 104 are disposed on first surface 110 of substrate 102. Although in the illustrated embodiment of FIG. 1, two semiconductor dies 104 are disposed on substrate 102, in other embodiments, any number of semiconductor dies 104 may be mounted on substrate 102 as per application requirements. For example, an array of semiconductor dies 104 may be organized in a grid pattern on substrate 102. The array includes more than two semiconductor dies 104 arranged in an M×N array, wherein each of M and N are non-zero integers exceeding two. The grid pattern may be square, rectangular, substantially circular (to meet a disc shape), or may have another shape. The array may extend in the X-Y plane of substrate 102. Further, multiple sets of substrate interconnects 114 may allow high speed data/signal transfer between adjacent semiconductor dies 104.

Each semiconductor die 104 include an Integrated Circuit (IC). Each semiconductor die 104 is made of a semiconductor material, such as silicon. In the illustrated embodiment of FIG. 1, each semiconductor die 104 is mounted by flip-chip or controlled collapse chip connection (C4) method onto first surface 110 of substrate 102. However, each semiconductor die 104 may be mounted on first surface 110 of substrate 102 by other methods, such as wire bonding. A plurality of first interconnects 116 electrically connect each semiconductor die 104 to substrate 102. Therefore, two sets of first interconnects 116 are coupled to respective semiconductor dies 104. First interconnects 116 also mount respective semiconductor dies 104 on first surface 110. In the illustrated embodiment of FIG. 1, first interconnects 116 are bumps or dots that are used in flip-chip mounting of each semiconductor die 104. First interconnects 116 may therefore be flip-chip bump interconnects. However, first interconnects 116 may alternatively include wires. First interconnects 116 may have a relatively low pitch, for example, about 130 microns (μm). Pitch is defined as the minimum center-to-center distance between adjacent bumps. Such a low pitch may reduce a volume of each first interconnect 116, resulting in low electrical resistance and inductance of each first interconnect 116. First interconnects 116 may therefore be used for high speed transmission of data and/or signals to and from respective semiconductor die 104.

One or more first interconnects 116 of each semiconductor die 104 is electrically connected to one or more substrate interconnects 114. One or more substrate interconnects 114 electrically connect one or more first interconnects 116 of each semiconductor die 104 to each other. One substrate interconnect 114 may electrically connect one first interconnect 116 associated with one semiconductor die 104 to one first interconnect 116 associated with another semiconductor die 104. In the illustrated embodiment of FIG. 1, two substrate interconnects 114 electrically connect two first interconnects 116 coupled to one semiconductor die 104 to two first interconnects 116 coupled to another semiconductor die 104. However, any number of substrate interconnects 114 may be used for electrically connecting semiconductor dies 104. One or more substrate interconnects 114 may therefore act as intra-substrate interconnects between semiconductor dies 104. One or more substrate interconnects 114 allow transmission of data and/or signals between semiconductor dies 104. Specifically, connection between semiconductor dies 104 may allow high speed transmission of data and/or signals between semiconductor dies 104. For example, connection between semiconductor dies 104 may have a high bandwidth allowing data transfer speeds greater than 50 gigabytes/sec (Gbps). Substrate interconnects 114 may also allow semiconductor dies 104 to be placed closer to each other in the X-Y plane of substrate 102. Specifically, substrate interconnects 114 may lower a distance "D" between semiconductor dies 104 along the X-Y plane. Such close placement of semiconductor dies 104 may reduce a warpage of substrate 102.

An underfill 118 is provided between each semiconductor die 104 and first surface 110 of substrate 102. Underfill 118 may include an electrically insulating adhesive. Further, a Thermal Interface Material (TIM) 120 is provided on a rear surface 122 of each semiconductor die 104. TIM 120 may include a thermally conductive material, such as a metal or a metal alloy. A cold plate 123 is mounted on or interfaced with TIM 120 of each semiconductor die 104. Cold plates 123 provide thermal management or cooling of respective semiconductor dies 104. In certain embodiments, an embedded cap (not shown) is provided on each semiconductor die 104 to mitigate noise on each semiconductor die 104.

A plurality of electrical connectors 124 are disposed on second surface 112 of substrate 102. One electrical connector 124 is provided for each semiconductor die 104. Therefore, in the illustrated embodiment, two electrical connectors 124 are disposed opposite to respective semiconductor dies 104. A plurality of second interconnects 126 electrically connect respective electrical connector 124 to substrate 102. Second interconnects 126 may also mount respective electrical connector 124 on second surface 112 of substrate 102. In the illustrated embodiment of FIG. 1, second interconnects 126 are a Ball Grid Array (BGA) for mounting respective electrical connector 124 to second surface 112 of substrate 102. Each second interconnect 126 is a ball or a BGA interconnect. However, second interconnects 126 may be any conductive element, such as contact pads, wires, and so forth. Two sets of second interconnects 126 are provided for respective electrical connectors 124. Second interconnects 126 may be connected to one or more interconnects (not shown) of substrate 102. One or more interconnects of substrate 102 may further be electrically connected to one or more first interconnects 116 of corresponding semiconductor dies 104. Electrical connectors 124 may be electrically connected to corresponding semiconductor dies 104 via one or more second interconnects 126, interconnects of substrate 102 and first interconnects 116.

In the illustrated embodiment of FIG. 1, each electrical connector 124 includes an interposer 128 and a socket 130. However, electrical connector 124 may have any alternative configuration within the scope of the present disclosure. Interposer 128 provides electrical interface routing between second interconnects 126 and socket 130. Socket 130 may include multiple conductive elements, such as pins. One or more conductive elements of socket 130 are electrically connected to one or more second interconnects 126 via interposer 128.

Each electrical connector 124 is mounted or disposed on second surface 112 of substrate 102 opposite to respective semiconductor die 104. Specifically, each electrical connector 124 may be provided in a shadow of respective semiconductor die 104. Each electrical connector 124 may be disposed between shadow lines or edges of respective semiconductor die 104. Alternatively, each electrical connector 124 may extend beyond the shadow lines or edges of respective semiconductor die 104.

In certain embodiments, an underfill 132 is provided between each electrical connector 124 and second surface 112 of substrate 102. Underfill 118 may include an electrically insulating adhesive. Underfill 132 may also enclose second interconnects 126.

Each power supply module 106 is detachably connected to socket 130 of respective electrical connector 124. Power supply modules 106 may therefore be easily removed from respective sockets 130 for servicing or replacement. For example, each power supply module 106 may be plugged into respective socket 130. Each power supply module 106 is also electrically connected to respective electrical connector 124. Further, each power supply module 106 is electrically connected to respective semiconductor die 104 via electrical connector 124, one or more second interconnects 126, one or more interconnects of substrate 102, and one or more first interconnects 116. In certain embodiments, each power supply module 106 is a voltage regulator module that provides a regulated voltage output to respective semiconductor die 104. Voltage regulator module may receive power from an external source and include suitable circuitry to provide the regulated voltage output. Voltage regulator module may include various electrical elements, for example, one or more switches, inductors, capacitors, diodes, etc. In certain embodiments, voltage regulator module provides a substantially constant Direct Current (DC) voltage to respective semiconductor die 104.

Each power supply module 106 is mounted or disposed on second surface 112 of substrate 102 opposite to respective semiconductor die 104. Specifically, power supply module 106 may be provided in a shadow of respective semiconductor die 104. Each power supply module 106 may be disposed between shadow lines or edges of respective semiconductor die 104. Alternatively, each power supply module 106 may extend beyond the shadow lines or edges of respective semiconductor die 104.

Number of power supply modules 106 may depend upon number of semiconductor dies 104 disposed on substrate 102. Specifically, one power supply module 106 is provided for one semiconductor die 104. In the illustrated embodiment of FIG. 1, electronic assembly 100 includes two power supply modules 106 for two semiconductor dies 104. In certain embodiments, if electronic assembly 100 includes an M×N array of semiconductor dies 104 disposed on first surface 110, then an M×N array of power supply modules 106 is disposed on second surface 112, wherein each of M and N are non-zero integers exceeding two. Further, each power supply module 106 of the M×N array is disposed opposite to corresponding semiconductor die 104. A grid pattern of the M×N array may be square, rectangular, substantially circular (to meet a disc shape), or may have another shape.

In a general configuration of electronic assembly 100, plurality of semiconductor dies 104 are mounted on first surface 110 of substrate 102 via first interconnects 116. Plurality of semiconductor dies 104 are electrically connected to each other via plurality of substrate interconnects 114. Further, plurality of first interconnects 116 are disposed on first surface 110 of substrate 102. Plurality of first interconnects 116 electrically connect respective semiconductor die 104 to substrate 102. Plurality of electrical connectors 124 are mounted on second surface 112 of substrate 102 via second interconnects 126. Each electrical connector 124 is disposed opposite to respective semiconductor die 104. Further, plurality of second interconnects 126 are disposed on second surface 112 of substrate 102. Plurality of second interconnects 126 electrically connect respective electrical connector 124 to substrate 102. Plurality of power supply modules 106 corresponding to plurality of semiconductor dies 104 are further provided. Each power supply module 106 is detachably connected to respective electrical connector 124. Moreover, each electrical connector 124 includes interposer 128 and socket 130. Interposer 128 is electrically connected to plurality of second interconnects 126. Socket 130 is detachably connected to respective power supply module 106.

Electronic assembly 100 may therefore include a double-sided assembly or configuration with semiconductor dies 104 disposed or mounted on first surface 110 of substrate 102, and electrical connectors 124 and corresponding power supply modules 106 disposed or mounted on second surface 112 of substrate 102. Such a double-sided assembly may allow high density packaging or integration of components on substrate 102. Substrate interconnects 114 may allow high speed data/signal transfer between semiconductor dies 104. High density packaging of components may allow electronic assembly 100 to be used in applications having size constraints.

Double-sided assembly and high density packaging of components may potentially lead to warpage of substrate 102. Substrate 102 may have a low thickness along the Z-axis for improved electrical performance. A relatively large area of substrate 102 to accommodate more components may also contribute to warpage. As a result, substrate 102 may tend to warp during assembly and/or post assembly of various components. Stiffening members 108 are mechanical stiffening structures that control warpage of substrate 102. Stiffening members 108 may reduce or prevent warpage of substrate 102 during assembly and/or post assembly of various components. In certain embodiments, stiffening members 108 keep warpage of substrate 102 within certain limits to allow high density and double-sided packaging of components on substrate 102. For example, stiffening members 108 may keep warpage of substrate 102 within certain limits during mounting of semiconductor dies 104 on substrate 102 by flip-chip method. Stiffening members 108 may also allow mounting of various thermal and mechanical members on substrate 102 without significant warpage. For example, stiffening members 108 may allow cold plates 123 to be mounted on or interfaced with respective semiconductor dies 104.

In the illustrated embodiment of FIG. 1, each stiffening member 108 is a double-sided stiffening structure including a first stiffening portion 134 and a second stiffening portion 136. In this embodiment, the stiffening member 108 comprises hollow cylindrical portions. Although it should be realized that other three dimensional shapes, including cubic, pentagonal, hexagonal or other shapes with hollow central portions may function similarly. In one example, the hollow cylindrical shape has a through hole traversing the longitudinal axis of the stiffening member.

In one embodiment, first stiffening portion 134 is disposed or mounted on first surface 110 of substrate 102, while second stiffening portion 136 is disposed or mounted on second surface 112 of substrate 102. As a result, each stiffening member 108 may control warpage on both sides of substrate 102. First and second stiffening portions 134, 136 may be made of a suitable material, such as metal, metal alloys, polymers, and so forth. In the illustrated embodiment, each stiffening member 108 is coupled to substrate 102 by a fastener assembly 138. However, stiffening members 108 may be coupled to substrate 102 by any alternative methods, such as soldering, adhesives, snap-fit connections, and so forth. The fastener assembly 138 includes a bolt 140 and a nut 142. Bolt 140 passes through substrate 102, and first and second stiffening portions 134, 136 of stiffening member 108. Axially aligned through-apertures (not shown) may be provided in first and second stiffening portions 134, 136, and substrate 102 for bolt 140 to pass through. Nut 142 is disposed proximal to an end of bolt 140. Thus, as shown the stiffening member may comprise a bolt or screw traversing the interior of the stiffening member. Specifically, nut 142 is disposed adjacent to second stiffening portion 136. Upon tightening nut 142, first and second stiffening portions 134, 136 are removably coupled to substrate 102. An optional intermediate layer 143 may be disposed between each of first and second stiffening portions 134, 136 and substrate 102. Intermediate layers 143 may reduce or prevent wear of substrate 102 due to the mounting of stiffening member 108. Intermediate layers 143 may be made of a sacrificial material, for example, a polymer.

Each of first and second stiffening portions 134, 136 may include a cross-section having a suitable shape, for example, circular, elliptical, oval, polygonal, etc. Mass and dimensions of each stiffening member 108 including first and second stiffening portions 134, 136 may depend upon stiffening requirements of substrate 102. Number of stiffening members 108 may also depend upon stiffening requirements of substrate 102. Stiffening members 108 may impart sufficient structural strength and rigidity to substrate 102 in order to resist warpage.

A number of stiffening members 108 may be provided at suitable locations on substrate 102 to control warpage. In the illustrated embodiment of FIG. 2, six stiffening members 108 are coupled to substrate 102. Stiffening members 108 are arranged in two rows and three columns. Each row has three stiffening members 108, while each column has two stiffening members 108. Each row of three stiffening members 108 is disposed proximal to respective longitudinal edge 111 of substrate 102. Further, two columns of stiffening members 108 are disposed proximal to respective lateral edges 113 of substrate 102. Third column of two stiffening members 108 are disposed between semiconductor dies 104. Therefore, four stiffening members 108 may be disposed proximal to respective four corners of each semiconductor die 104. Such an arrangement may minimize warpage of substrate 102 during mounting of semiconductor dies 104 on substrate 102 by flip-chip method.

Electronic assembly 100 further includes at least one external interconnect 144. External interconnect 144 is disposed or mounted on first surface 110 of substrate 102 proximal to lateral edge 113. External interconnect 144 electrically connects substrate 102 with an external component, for example, another substrate (not shown). External interconnect 144 may act as an inter-substrate interconnect for substrate 102, allowing transfer of data/signals between substrate 102 and another substrate. In certain embodiments, external interconnect 144 allows transfer of data/signals between one or more semiconductor dies 104 and semiconductor dies (not shown) of another substrate. Interconnection between semiconductor dies 104 and external semiconductor dies may be required to generate a required computing power. External interconnect 144 may be electrically connected to one or more semiconductor dies 104 via one or more interconnects (not shown) of substrate 102 and one or more first interconnects 116. External interconnect 144 may include one or more electrically conductive elements, for example, conductive pads, wires, conductive traces, or a combination thereof.

Though one external interconnect 144 is depicted in FIG. 1, electronic assembly 100 may include any number of external interconnects 144 as per application requirements. External interconnects 144 may be provided at any suitable locations on substrate 102, for example, on first surface 110, on second surface 112, proximal to lateral edges 113, proximal to longitudinal edges 111, and so forth. Substrate 102 may be electrically connected with any number of substrate panels as per application requirements (e.g., required computing power).

Electronic assembly 100 may enable double-sided and high density packaging of components on substrate 102, while minimizing warpage of substrate 102 during and/or after assembly. Substrate 102 of electronic assembly 100 may also be interconnected with substrate panels of other assemblies as per application requirements. Electronic assembly 100 may have reduced footprint and form factor. Power supply modules 106 may be removed from respective electrical connectors 124 for servicing or replacement.

Figure 3:
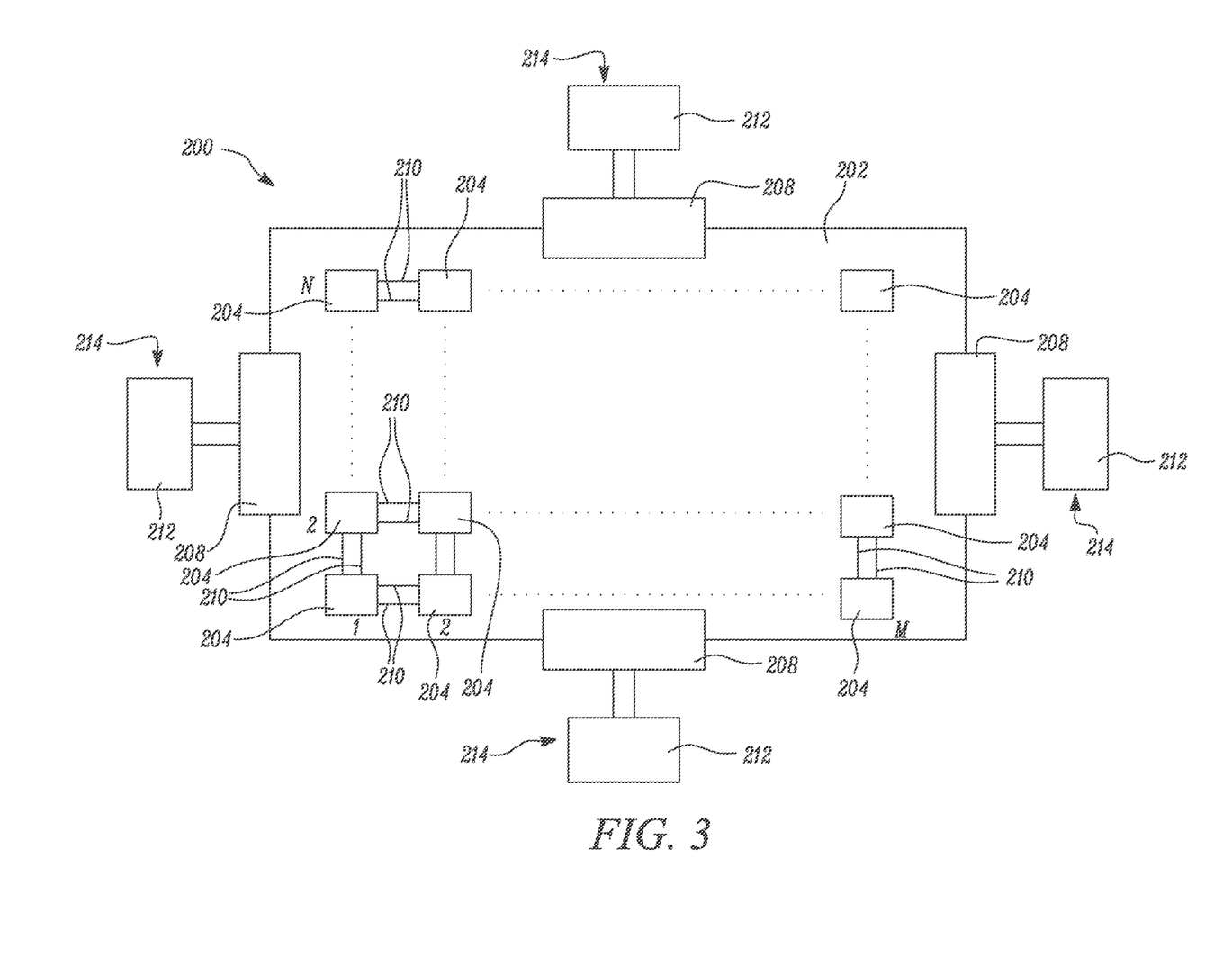
FIG. 3 is a schematic diagram illustrating an electronic assembly including an array of semiconductor dies according to the present disclosure.

FIG. 3 illustrates a schematic view of an electronic assembly 200. Electronic assembly includes a substrate 202, an array of semiconductor dies 204 mounted on substrate 202, and a plurality of external interconnects 208 mounted on substrate 202. Semiconductor dies 204 are arranged in an M×N array, with M rows and N columns. Each of M and N are non-zero integers exceeding two. Further, substrate interconnects 210 electrically connect semiconductor dies 204 to each other. Sets of substrate interconnects 210 may electrically connect adjacent semiconductor dies 204 along each row and each column. Therefore, each semiconductor die 204 may be electrically connected to all adjacent semiconductor dies 204 along corresponding row and column. Substrate interconnects 210 may allow high speed data/signal transfer between semiconductor dies 204. An M×N array of power supply modules (not shown) is provided on an opposite surface of substrate 202. Each power supply module is disposed opposite to respective semiconductor die 204.

Four external interconnects 208 electrically connect substrate 202 to respective external substrates 212 of other electronic assemblies 214. Electronic assemblies 200 and 214 may form an integrated system. Such inter-substrate connections may connect semiconductor dies 204 with other IC components mounted on external substrates 212. This may improve computing power of the integrated system to meet application requirements.

The system and methods above has been described in general terms as an aid to understanding details of preferred embodiments of the present disclosure. Other preferred embodiments of the present disclosure include the described application for electric vehicles. In the description herein, numerous specific details are provided, such as examples of components and/or methods, to provide a thorough understanding of embodiments of the present disclosure. One skilled in the relevant art will recognize, however, that an embodiment of the disclosure can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present disclosure.

Reference throughout this specification to "one embodiment", "an embodiment", or "a specific embodiment" means that a particular feature, structure, or characteristic described in connection with the embodiment is included in at least one embodiment of the present disclosure and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present disclosure may be combined in any suitable manner with one or more other embodiments. It is to be understood that other variations and modifications of the embodiments of the present disclosure described and illustrated herein are possible in light of the teachings herein and are to be considered as part of the spirit and scope of the present disclosure.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present disclosure, including what is described in the Abstract, is not intended to be exhaustive or to limit the disclosure to the precise forms disclosed herein. While specific embodiments of, and examples for, the disclosure are described herein for illustrative purposes only, various equivalent modifications are possible within the spirit and scope of the present disclosure, as those skilled in the relevant art will recognize and appreciate. As indicated, these modifications may be made to the present disclosure in light of the foregoing description of illustrated embodiments of the present disclosure and are to be included within the spirit and scope of the present disclosure.

Thus, while the present disclosure has been described herein with reference to particular embodiments thereof, a latitude of modification, various changes and substitutions are intended in the foregoing disclosures, and it will be appreciated that in some instances some features of embodiments of the disclosure will be employed without a corresponding use of other features without departing from the scope and spirit of the disclosure as set forth. Therefore, many modifications may be made to adapt a particular situation or material to the essential scope and spirit of the present disclosure. It is intended that the disclosure not be limited to the particular terms used in following claims and/or to the particular embodiment disclosed as the best mode contemplated for carrying out this disclosure, but that the disclosure will include any and all embodiments and equivalents falling within the scope of the appended claims. Thus, the scope of the disclosure is to be determined solely by the appended claims.

What we claim is:

1. An electronic assembly comprising:
   a substrate comprising a first surface and a second surface opposite to the first surface, the substrate further comprising a plurality of substrate interconnects;
   a plurality of semiconductor dies mounted on the first surface of the substrate, wherein the plurality of semiconductor dies are electrically connected to each other via the plurality of substrate interconnects;
   a plurality of power supply modules mounted on the second surface of the substrate, wherein each power supply module is disposed opposite to a respective semiconductor die; and
   a plurality of stiffening members coupled to the substrate, wherein the plurality of stiffening members are configured to control warpage of the substrate, and wherein individual stiffening members comprise:
   a first stiffening portion disposed on the first surface of the substrate; and
   a second stiffening portion disposed on the second surface of the substrate.

2. The electronic assembly of claim 1, wherein each stiffening member has a hollow cylindrical shape with a through hole traversing a longitudinal axis of the stiffening member.

3. The electronic assembly of claim 1, wherein each stiffening member further comprises a bolt or screw traversing a interior of the stiffening member.

4. The electronic assembly of claim 3, wherein the stiffening member is a bolt, and the bolt is maintained in place with a nut.

5. The electronic assembly of claim 1, further comprising a plurality of first interconnects disposed on the first surface of the substrate, the plurality of first interconnects electrically connecting a respective semiconductor die to the substrate.

6. The electronic assembly of claim 1, further comprising a plurality of electrical connectors mounted on the second surface of the substrate, each electrical connector detachably connecting a respective power supply module to the substrate.

7. The electronic assembly of claim 6, further comprising a plurality of second interconnects disposed on the second surface of the substrate, the plurality of second interconnects electrically connecting a respective electrical connector to the substrate.

8. The electronic assembly of claim 7, wherein the plurality of second interconnects are a ball grid array.

9. The electronic assembly of claim 7, wherein each electrical connector comprises:
   an interposer electrically connected to the plurality of second interconnects; and a socket detachably connected to the respective power supply module.

10. The electronic assembly of claim 5, wherein the plurality of first interconnects are bumps.

11. The electronic assembly of claim 1, further comprising an external interconnect that electrically connects the substrate to another substrate.

12. The electronic assembly of claim 1, wherein each stiffening member is coupled to the substrate by a fastener assembly.

13. The electronic assembly of claim 1, wherein each of the plurality of stiffening members comprises an intermediate layer disposed between the first stiffening portion and the second stiffening portion, and wherein the intermediate layer is configured to reduce wear of the substrate.

14. An electronic assembly comprising:
a substrate comprising a first surface and a second surface opposite to the first surface, the substrate further comprising a plurality of substrate interconnects;
a plurality of semiconductor dies mounted on the first surface of the substrate, wherein the plurality of semiconductor dies are electrically connected to each other via the plurality of substrate interconnects;
a plurality of electrical connectors mounted on the second surface of the substrate, wherein each electrical connector is disposed opposite to a respective semiconductor die;
a plurality of power supply modules corresponding to the plurality of semiconductor dies, wherein each power supply module is detachably connected to a respective electrical connector; and
a plurality of stiffening members coupled to the substrate, wherein the plurality of stiffening members are configured to control warpage of the substrate, and wherein individual stiffening members comprise:
a first stiffening portion disposed on the first surface of the substrate; and
a second stiffening portion disposed on the second surface of the substrate.

15. The electronic assembly of claim 14, further comprising a plurality of first interconnects disposed on the first surface of the substrate, the plurality of first interconnects electrically connecting a respective semiconductor die to the substrate.

16. The electronic assembly of claim 14, further comprising a plurality of second interconnects disposed on the second surface of the substrate, the plurality of second interconnects electrically connecting a respective electrical connector to the substrate.

17. The electronic assembly of claim 16, wherein each electrical connector comprises:
an interposer electrically connected to the plurality of second interconnects; and
a socket detachably connected to a respective power supply module.

18. The electronic assembly of claim 14, further comprising an external interconnect that electrically connects the substrate to another substrate.

19. An electronic assembly comprising:
a substrate comprising a first surface and a second surface opposite to the first surface;
a semiconductor die mounted on the first surface of the substrate;
a power supply module mounted on the second surface of the substrate, wherein the power supply module is disposed opposite to the semiconductor die; and
a plurality of stiffening members coupled to the substrate, wherein the plurality of stiffening members are configured to control warpage of the substrate, and wherein individual stiffening members comprise:
a first stiffening portion disposed on the first surface of the substrate; and
a second stiffening portion disposed on the second surface of the substrate.

20. The electronic assembly of claim 19, further comprising a plurality of second interconnects disposed on the second surface of the substrate, the plurality of second interconnects electrically connecting a respective electrical connector to the substrate.

21. The electronic assembly of claim 20, wherein each electrical connector comprises:
an interposer electrically connected to the plurality of second interconnects; and
a socket detachably connected to a respective power supply module.

22. The electronic assembly of claim 19, further comprising an external interconnect that electrically connects the substrate to another substrate.

23. The electronic assembly of claim 19, wherein each of the plurality of stiffening members comprises an intermediate layer disposed between the first stiffening portion and the second stiffening portion, and wherein the intermediate layer is configured to reduce wear of the substrate.

* * * * *